United States Patent
Vetter et al.

(10) Patent No.: US 9,551,067 B2
(45) Date of Patent: Jan. 24, 2017

(54) COATING METHOD FOR DEPOSITING A LAYER SYSTEM ON A SUBSTRATE AND SUBSTRATE HAVING A LAYER SYSTEM

(71) Applicant: Sulzer Metaplas GmbH, Bergisch Gladbach (DE)

(72) Inventors: Jörg Vetter, Bergisch Gladbach (DE); Georg Erkens, Aachen (DE); Jürgen Müller, Olpe (DE)

(73) Assignee: OERLIKON SURFACE SOLUTIONS AG, PFAEFFIKON, Pfaeffikon (CH)

( * ) Notice: Subject to any disclaimer, the term of this patent is extended or adjusted under 35 U.S.C. 154(b) by 206 days.

(21) Appl. No.: 13/865,464

(22) Filed: Apr. 18, 2013

(65) Prior Publication Data
US 2013/0302596 A1 Nov. 14, 2013

(30) Foreign Application Priority Data
Apr. 20, 2012 (EP) .................... 12164959

(51) Int. Cl.
| | |
|---|---|
| *C23C 14/34* | (2006.01) |
| *C23C 14/00* | (2006.01) |
| *C23C 14/06* | (2006.01) |
| *C23C 14/32* | (2006.01) |
| *C23C 14/35* | (2006.01) |

(52) U.S. Cl.
CPC ....... *C23C 14/3485* (2013.01); *C23C 14/0068* (2013.01); *C23C 14/0084* (2013.01); *C23C 14/06* (2013.01); *C23C 14/325* (2013.01); *C23C 14/3471* (2013.01); *C23C 14/3492* (2013.01); *C23C 14/35* (2013.01); *Y10T 428/265* (2015.01)

(58) Field of Classification Search
CPC ..... C23C 14/14; C23C 14/3485; C23C 14/352
See application file for complete search history.

(56) References Cited

U.S. PATENT DOCUMENTS

| | | | | |
|---|---|---|---|---|
| 5,234,561 | A | * | 8/1993 | Randhawa ............ C23C 14/325 204/192.12 |
| 5,306,407 | A | | 4/1994 | Hauzer et al. |
| 7,395,426 | B2 | | 7/2008 | Lee et al. |

(Continued)

FOREIGN PATENT DOCUMENTS

| | | |
|---|---|---|
| DE | 102008021912 A1 | 11/2009 |
| DE | 102010028558 A1 * | 11/2011 |

(Continued)

OTHER PUBLICATIONS

EP Search Report for application 12164959.4, Oct. 19, 2012.

*Primary Examiner* — Jason M Berman
(74) *Attorney, Agent, or Firm* — Robert S. Green

(57) ABSTRACT

The invention relates to a coating method for depositing a layer system formed from hard material layers on a substrate, by depositing at least one contact layer including the evaporation material on the surface of the substrate only by means of a cathodic vacuum arc evaporation source. After the depositing of the contact layer, at least one intermediate layer is deposited in the form of a nano-layer intermediate layer in a hybrid phase or as a nanocomposite layer, including the evaporation material and the discharge material, by parallel operation of a cathodic vacuum arc evaporation source and of a magnetron discharge source.

19 Claims, 6 Drawing Sheets

(56) References Cited

U.S. PATENT DOCUMENTS

Figure 1A:
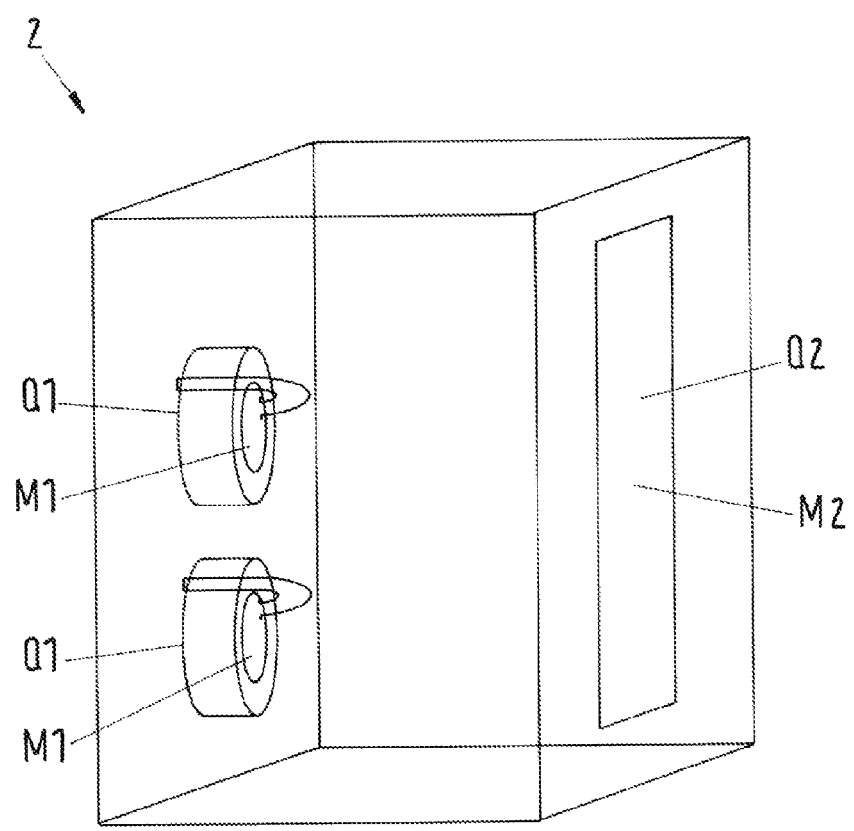

2008/0135400 A1* 6/2008 Kadlec et al. ........... 204/192.12
2009/0078565 A1    3/2009 Rodmar et al.
2010/0304102 A1* 12/2010 Vetter ......................... 428/213
2013/0209834 A1*  8/2013 Engelhart et al. ............ 428/684

FOREIGN PATENT DOCUMENTS

| EP | 1783245 A1 |   | 5/2007 |
|----|------------|---|--------|
| EP | 2037000 A2 | * | 3/2009 |
| WO | 9100374 A1 |   | 1/1991 |
| WO | 02070776 A1 |   | 9/2002 |
| WO | 2009052874 A1 |   | 4/2009 |

\* cited by examiner

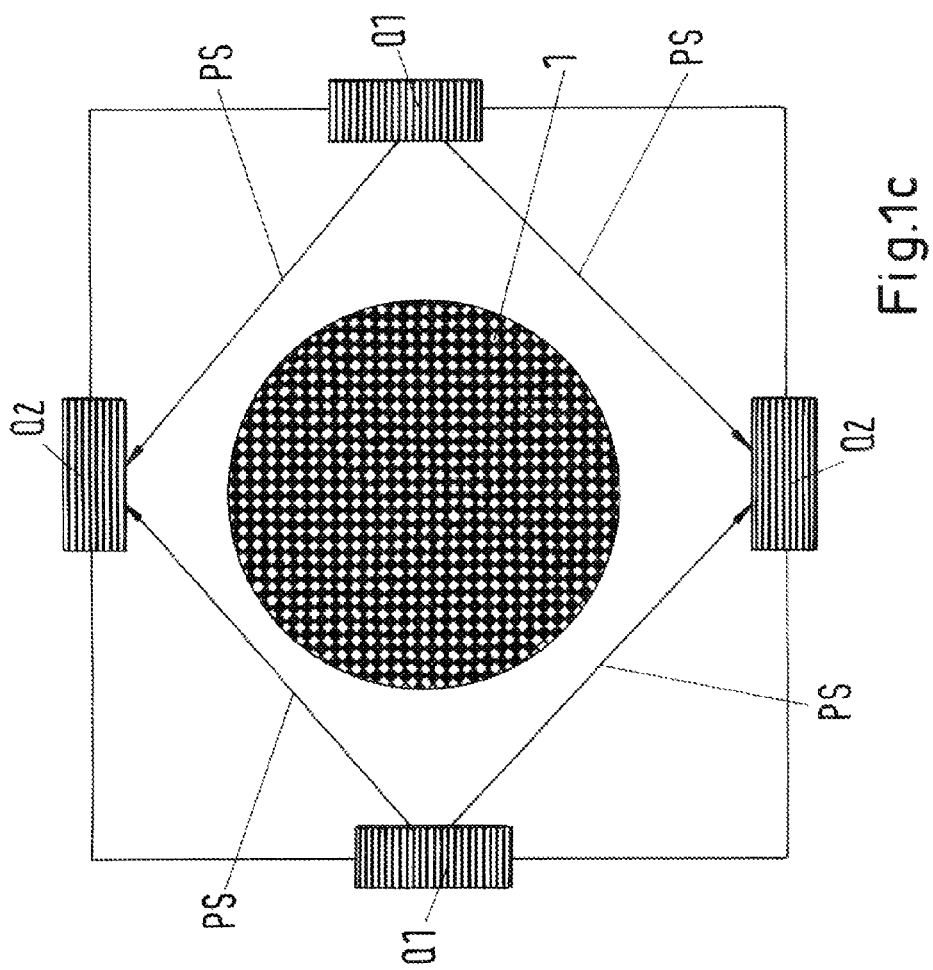

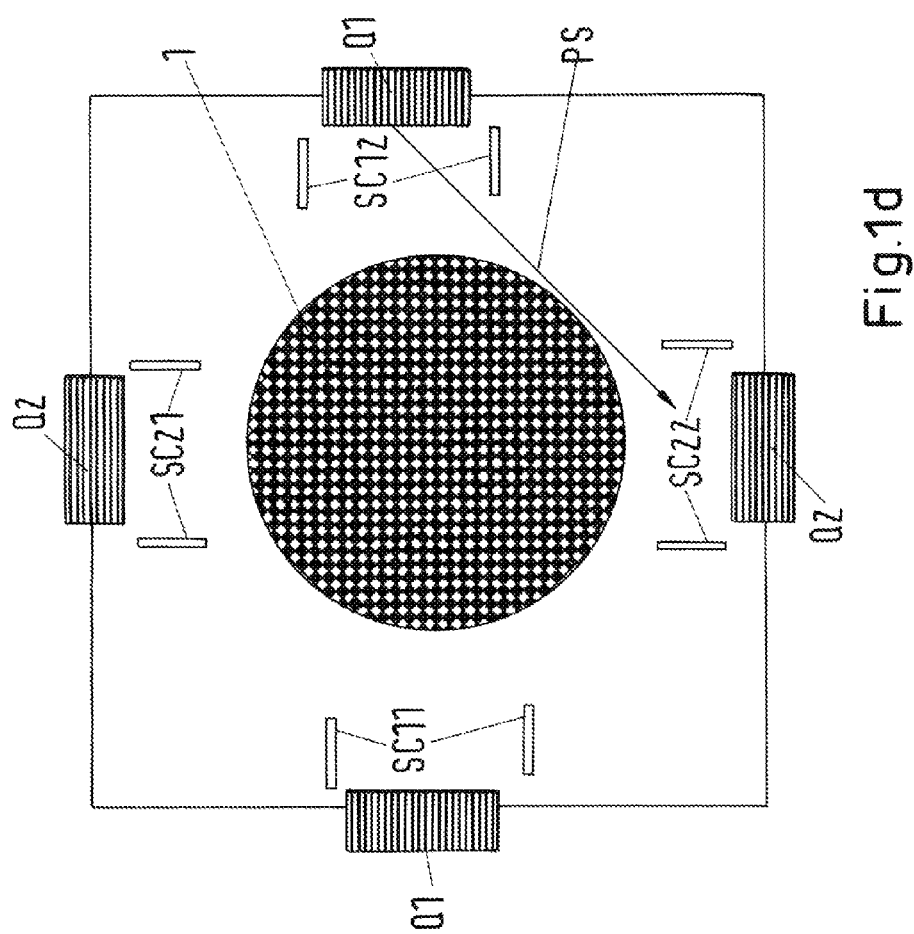

COATING METHOD FOR DEPOSITING A LAYER SYSTEM ON A SUBSTRATE AND SUBSTRATE HAVING A LAYER SYSTEM

The present application claims priority under 35 U.S.C. §119 of European Patent Application No. 12164959.4 filed on Apr. 20, 2012, the disclosure of which is expressly incorporated by reference herein in its entirety.

The invention relates to a coating method for depositing a layer system of hard material layers on a substrate using an arc evaporation source and a magnetron discharge source which can be operated in a HIPIMS mode and to a substrate having a layer system in accordance with the preamble of the independent claim of the respective category.

PVD layers known from the prior art which are deposited using cathodic vacuum arc evaporation techniques (CVAE) demonstrate an excellent tribological behavior in a number of applications in the field of wear protection. The most varied tools (cutting, shaping, primary shaping, plastic) and mechanical parts (inter alia tongs) as well as engine parts (inter alia piston rings, valves) are today coated by means of nitride layers, carbide layers and oxidized layers and their mixtures. The known PVD processes are characterized by a high coating rate, by dense layer structures due to the high ionization of the evaporated material and by process stability. The known cathodic vacuum arc evaporation (CVAE) techniques, however, also have a number of disadvantages, on the other hand.

One substantial disadvantage is the droplet emission, which is unavoidable in practice, i.e. the emission of small metal splashes in the um to μm range which can have a negative effect in the generated layers in selected applications or which can make a surface finish after the coating absolutely essential to set sufficiently low roughness values. Another substantial disadvantage is that not all cathode materials can be industrially evaporated by cathodic vacuum arc evaporation (CVAE); these e.g. include materials such as Si, B, SiC, $B_4C$ and other materials known per se to the skilled person.

Classic DC magnetron sputtering in this respect substantially does not have these two above-named disadvantages when it is operated with typical, time-integrated power densities of up to 20 $W/cm^2$ on the target, with current densities on the target typically lying below 0.1 $A/cm^2$.

It must be noted in this respect with regard to the layer roughness that in individual cases, in particular with thick wear protection layers which are e.g. some μm thick and are manufactured under industrial conditions, a subsequent smoothing is frequently carried out by mechanical machining processes such as brushing, blasting, polishing and others to eliminate irritating growth-induced roughness peaks.

There is a larger variety with respect to the materials which can be used in classic DC magnetron sputtering than in the process of CVAE. For instance, in addition to metals and their alloys, less conductive materials and brittle materials such as Si; B, SiC, $B_4C$; $MoS_2$, $WS_2$ and others can be sputtered. The possibilities for the production capability of layer compositions are thereby considerably more versatile than in CVAE.

Classic DC magnetron sputtering, however, also has certain disadvantages. Classic DC magnetron sputtering is thus characterized by a lower coating rate in industrial plants in comparison with cathodic vacuum arc evaporation, which is naturally also en economic disadvantage in many different aspects. In addition, the layers produced in classic DC magnetron sputtering are frequently characterized by a pronounced columnar growth, due to the comparatively low ionization of the sputtered material, which unfortunately frequently results in a disadvantage in functionality of the layers in many applications. Classic DC magnetron sputtering was therefore constantly further developed and improved in the past few years. Considerable advances have been achieved in this respect by an operation of the magnetron in the pulsed mode with high currents or current densities, which results in an improved layer structure in the form of denser layers, in particular due to an improved ionization of the sputtered material. The columnar growth is thereby suppressed to a predefinable degree or can even be fully prevented. This process of magnetron sputtering in the pulsed mode with high currents or current densities is frequently also called "high ionized impulse magnetron sputtering"or HIPIMS in abbreviated form. The current densities at the target in HIPIMS typically exceed those of classic DC magnetron sputtering, i.e. they are above 0.1 $A/cm^2$ up to some $A/cm^2$, so that power densities of some 100 $W/cm^2$ up to $MW/cm^2$ can briefly be applied to the target.

The process conditions for depositing layers in magnetron sputtering and in cathodic vacuum arc evaporation (CVAE) are typically different.

Ar is usually used as the sputtering gas in magnetron sputtering. The corresponding reactive gas is added for the reactive deposition of nitride, carbide, or oxidized layers and their mixtures. Work is often carried out in practice using a gas flow of the argon which is larger than the flow of the reactive gas for the layer deposition. The coating pressure in usually in the range from 0.1 to 1 Pa.

Work is usually carried out without Ar in CVAE, i.e. with 100% reactive gas. Pure nitrogen is often used for the deposition of nitride layers. The reactive deposition of the layers is frequently carried out in the pressure range from 0.05 to 1 Pa. When powder metallurgical cathodes with a high Al portion are used, higher pressures have proven themselves in this respect. Reactive gas pressures in the range from 2 to 10 Pa are then typically used. Correspondingly, a conflict situation of the compatibility with regard to the pressure ranges and the gases used is to be assumed.

It is therefore the object of the invention to provide an improved coating process for manufacturing a multilayer system and, resulting from this, a substrate having an improved layer system which avoids the disadvantages known from the prior art.

The subject matters of the invention satisfying these objects are characterized by the features of the respective independent claims.

The dependent claims relate to particularly advantageous embodiments of the invention.

The invention thus relates to a coating method for depositing a layer system formed from hard material layers on a substrate which coating process includes the following method steps: Providing an evacuable process chamber having a cathodic arc evaporation source with an evaporation material (M1) and having a magnetron discharge source with a discharge material, wherein the magnetron discharge source can be operated in a HIPIMS mode. Subsequently, depositing at least one contact layer including the evaporation material on the surface of the substrate in a cathodic vacuum arc evaporation process only by means of the cathodic vacuum arc evaporation source. In accordance with the invention, after the depositing of the contact layer at least one intermediate layer is deposited in the form of a nanostructured mixed layer, in particular in the form of a nanolayer intermediate layer in a hybrid phase or as a nanocomposite layer, including the evaporation material and the discharge material, by parallel operation of the cathodic vacuum arc evaporation source and of the magnetron discharge source. In this respect, the magnetron discharge source is operated in the HIPIMS mode and subsequently at least one cover layer including the material is deposited only by means of the magnetron discharge source, with the magnetron discharge source being operated in the HIPIMS mode.

It has thus surprisingly become possible by the present invention to generate innovative multilayer layer systems which combine within themselves the advantages of both coating methods, namely the cathodic vacuum arc evaporation (CVAE) and the magnetron discharge process in the HIPIMS mode.

Figure 1B:
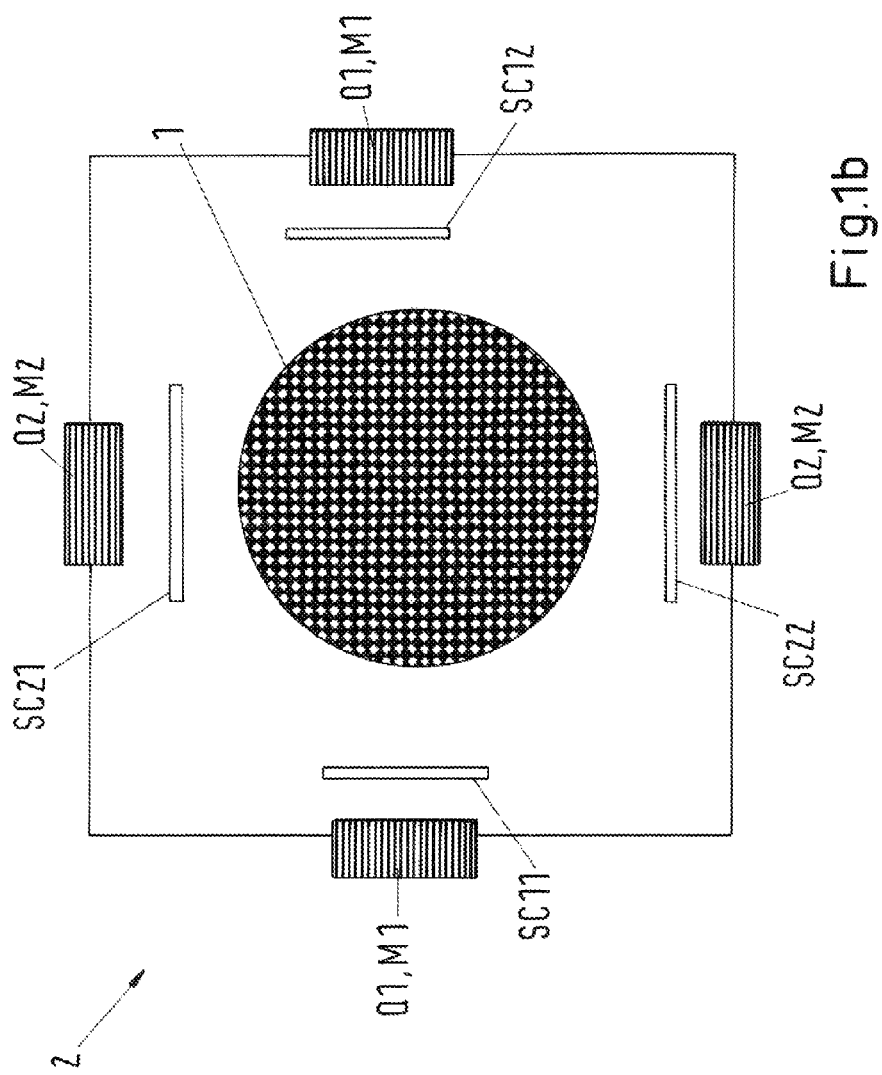
Figure 2:
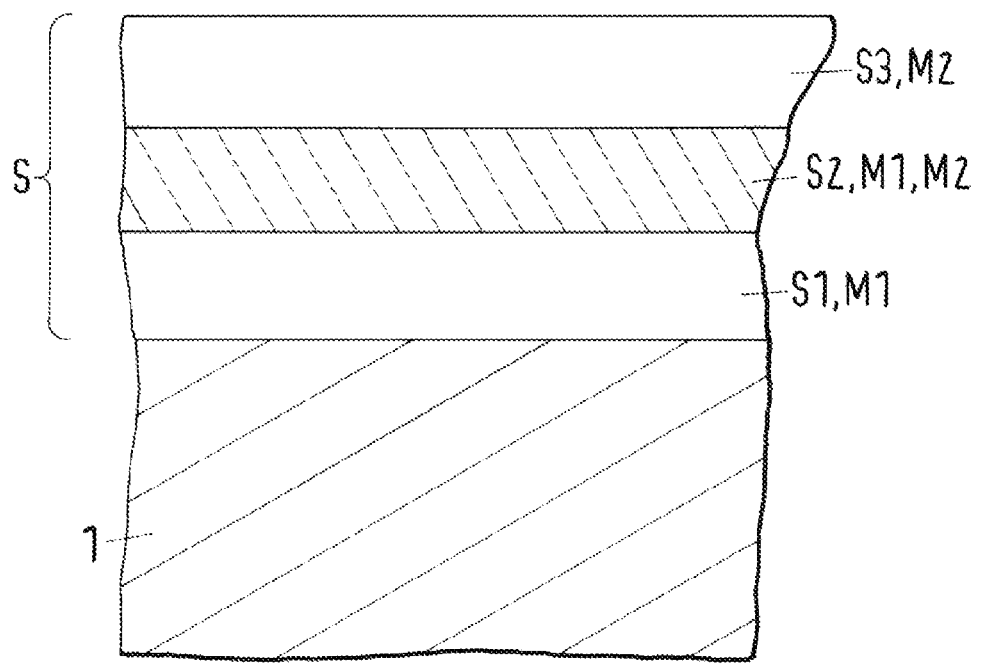
Figure 3A:
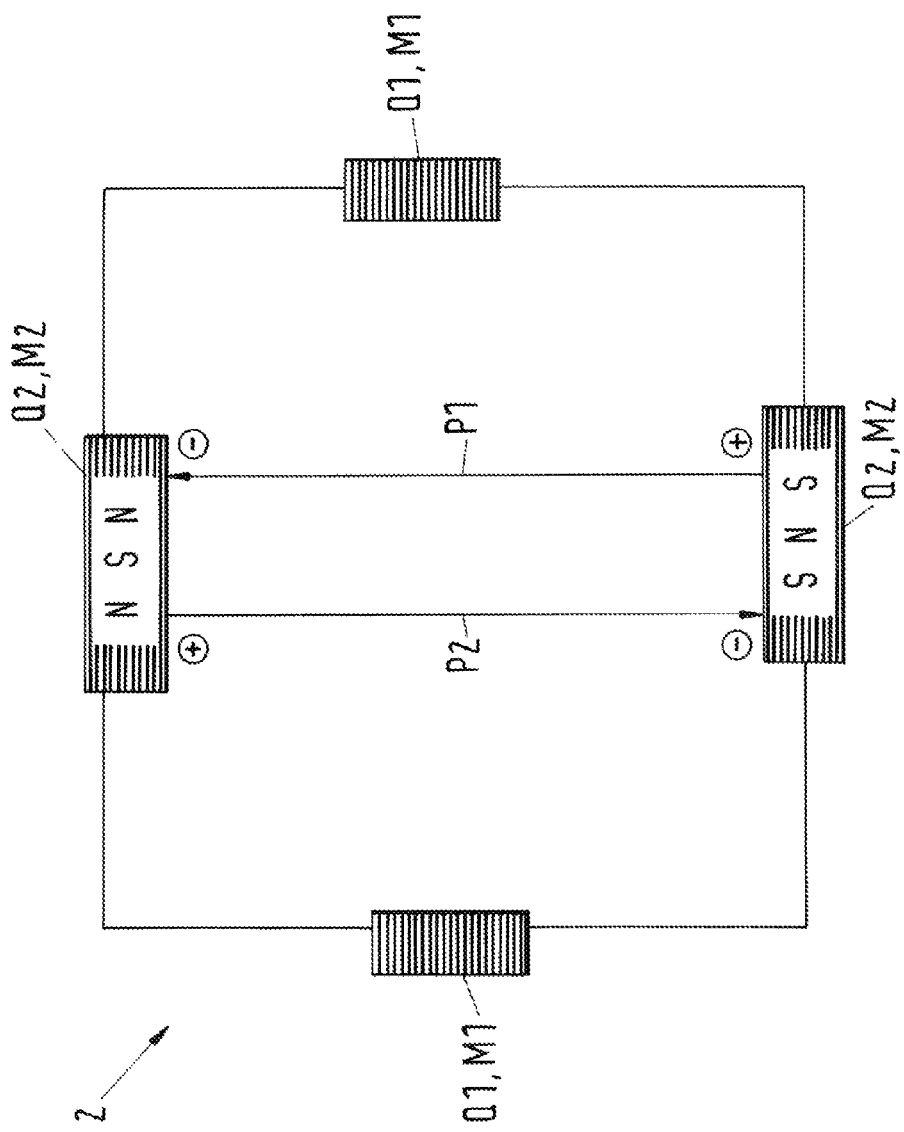

The invention will be explained in even more detail in the following with reference to the schematic drawing and to further specific embodiments. There are shown:

FIG. 1a in a schematic representation, a process chamber with a cathodic vacuum arc evaporation source (CVAE source) and a magnetron discharge source which can be operated in the HIPIMS mode (HIPIMS sputtering source);

FIG. 1b a process chamber with a plurality of evaporation sources and discharge sources;

FIG. 1c a process chamber with a plurality of evaporation sources and discharge sources without shutters;

FIG. 1d a process chamber with a plurality of evaporation sources and discharge sources with open shutters;

FIG. 2 schematically, a substrate in accordance with the invention with a three-layer layer system; and FIG. 3a a closed-field unbalanced magnetron HIPIMS arrangement.

In a particularly simple embodiment, an apparatus basis for carrying out the method in accordance with the invention is given, for example by a plant configuration in accordance with FIG. 1a which shows in a very schematic representation a process chamber 2 with a cathodic vacuum arc evaporation source Q1 which is also called a CVAE source Q1 in abbreviated form and with a magnetron discharge source Q2 which is operated in the HIPIMS mode in a method in accordance with the invention and which is also called a HIPIMS sputtering source Q2 in abbreviated form, or in even more abbreviated form also a HIPIMS source Q2.

In the following, the manufacture of a multilayer layer system S on a substrate 1 in accordance with the invention such as is shown schematically e.g. in FIG. 2 will first be discussed for a simple embodiment. The layer system in accordance with the invention in accordance with FIG. 2 should in this respect have as few growth disturbances as possible, with simultaneously a dense layer structure being aimed for. The layer system in accordance with the invention of FIG. 2 includes a contact layer S1 which is produced by means of a first evaporation material M1 to be atomized which is atomized by at least one first source Q1 in accordance with FIG. 1a and is applied to the substrate 1. It further includes a nanostructured intermediate layer S2 located on the contact layer S1 and including the evaporation material M1 and a further discharge material M2, wherein the discharge material M2 to be atomized is provided by at least one magnetron discharge source Q2 as well as a cover layer S3 which contains the material M2. Corresponding reactive gases are used in the process chamber 2 for setting nitride, carbide or oxide portions such as AlTiXN, AlCrXN, CrON (and their mixtures) in the layers during the deposition in the respective layers S1 to S3 in a manner known per se.

Two cathodic vacuum arc discharge sources Q1 (CVAE source) and at least one magnetron discharge source Q2 which can be operated in the HIPIMS mode (HIPIMS source) are installed in the process chamber 2 for coating the substrate 1 in accordance with FIG. 2.

In this respect, more complex arrangements of coating sources are also possible in the process chamber 2, such as schematically outlined in FIG. 1b, FIG. 1c, FIG. 1d and FIG. 1e.

FIG. 1b, for example, shows a cutaway view of a process chamber 2 for use in a further special operating mode for manufacturing layers in accordance with the invention. Two magnetron discharge sources Q2 with discharge material M2 are installed at two oppositely disposed flanges in the process chamber 2 in accordance with FIG. 1b. A plurality of cathodic vacuum arc evaporation sources Q1 with evaporation material M1 are located on oppositely disposed flanges offset by 90° with respect to the magnetron discharge sources Q2. In this respect, two pairs of vacuum arc evaporation sources Q1 are preferably used which are arranged above one another with respect to the chamber height and of which only one pair can be seen in the cutaway illustration of FIG. 1b. In the example of FIG. 1b, the magnetron discharge sources Q2 can, for example, be operated in the bipolar HIPIMS mode. A respective shutter SC11, SC12, SC21 and SC22, which can be closed or opened, are preferably located in front of the sources.

In the following, a first layer system will be described by way of example which was previously only able to be produced with insufficient quality using the process of cathodic vacuum arc evaporation.

AlTiN layers have proved themselves in a plurality of uses such as in cutting and shaping. In particular layers deposited by means of cathodic vacuum arc evaporation in this respect have a high adhesive strength. Vanadium-based layers in contrast have a special advantage when application temperatures around 600° C. and higher result in oxide formations which have excellent friction properties.

This combination can serve for the design of layers which allows layer sequences both with excellent friction properties and wear properties at corresponding operating temperatures.

For this purpose, cathodic vacuum evaporation sources Q1 and at least one magnetron discharge source Q2 in the HIPIMS mode were installed in a process chamber 2, as shown schematically in FIG. 1a, for example.

In a further special operating mode, the magnetron discharge sources Q2 were operated in the bipolar HIPIMS mode, as is shown schematically in FIG. 1b. In both cases, a layer sequence in accordance with FIG. 2 was deposited having a contact layer S1 of evaporation material M1, having an intermediate layer S2 of evaporation material M1 and discharge material M2 and having a top layer S3 of discharge material M2. A roughness was surprisingly adopted which was lower than that of the pure contact layers S1 without an intermediate layer S2 and/or top layer S2.

Further trial results and the procedure in the depositing of layer systems in accordance with the invention will be explained in somewhat more detail in the following.

Specifically, a layer system S in accordance with FIG. 2 was manufactured having an AlTiN contact layer S1 of AlTi as the evaporation material M1 and having a process gas containing nitrogen. An AlTiN—VZrN intermediate layer in the form of a nanostructured mixed layer was applied to the AlTiN contact layer. This means that the intermediate layer was manufactured from AlTi as the evaporation material M1 and from VZr as the discharge material M2 and the process gas containing nitrogen. Finally, a VZrN top layer of the discharge material M2 including VZr and from the process gas containing nitrogen is formed and is deposited on the intermediate layer. For comparison, pure AlTiN layers as well as two multilayer layer systems were deposited alone by means of cathodic vacuum arc evaporation. The trial results are compiled in Table 1 together with important layer parameters and trial parameters as well as the achieved roughness of the different layers. The layer thickness aimed for was approximately 4 μm, with the fluctuations in the layer thicknesses between the individual processes and within a layer system being at around +/−10% of the layer thickness.

Manufacture of the AlTiN layers:

First, after a pretreatment of the substrate known per se (e.g. heating to 500° C. and Ar ion cleaning by means of the AEGD process), an AlTiN layer was deposited on polished specimens in pure nitrogen at 6 Pa reactive gas pressure and in an evaporator current of 150 A. The bias voltage at the specimens amounted to 50 V during the coating. A typical roughness of approximately 0.21 μm was reached.

Surprisingly, the process was stable even though work was being carried out at pressures of several Pa, which is atypical for sputtering processes. At the same time, a sputtering of VZr from the target was found, even though the dominant gas was nitrogen. It is to be assumed that the sputtering process is assisted by the excitation of the nitrogen molecules or their atomization or even by ionization of the nitrogen atoms which is extremely high due to the simultaneous operation of CVAE. Furthermore, with the high bias voltages at the sputtering target (up to 1000 V), metal ions (Al or Ti) which are produced by CVAE could also contribute to the sputtering process. Unexpectedly, a very low roughness of Ra=0.13 μm was adopted which is lower than that of the pure Si layer.

As can clearly be seen from Table 1, a layer system having the layer sequence S1, S2, S3 can be manufactured using the coating method in accordance with the invention, said layer system having a considerably lower roughness than layers of in principal the same chemical composition which were manufactured using a process known from the prior art.

TABLE 1

Comparison of Examples 1 to 3 from the prior art with a layer from Example 4 in accordance with the invention

| Example | Layer S1 | Layer S2 | Layer S3 | Roughness Ra in μm | Pressure S1 + S2 | Pressure S3 | Gas S1 | Gas S2 | Gas S3 |
|---|---|---|---|---|---|---|---|---|---|
| 1 | AlTiN/CVAE 4 μm | None | None | 0.21 | 6 Pa | — | 100% N2 | 100% N2 | 100% N2 |
| 2 | AlTiN/CVAE 3 μm | None | VZrN/CVAE 1 μm | 0.42 | 6 Pa | 3 Pa | 100% N2 | 100% N2 | 100% N2 |
| 3 | AlTiN/CVAE 1.5 μm | AlTi/CVAE VZrN/CVAE 1.5 μm | VZrN/CVAE 1 μm | 0.55 | 6 Pa | 3 Pa | 100% N2 | 100% N2 | 100% N2 |
| 4 | AlTiN/CVAE 1.5 μm | AlTiN/CVAE VZrN/HIPIMS 1.5 μm | VZrN/HIPIMS 1 μm | 0.13 | 6 Pa | 0.8 Pa | 100% N2 | 90% N2 10% Ar | 50% Ar/50% N2 |

Only a cathodic vacuum evaporation process, AlTiN with top layer VZrN:

Such layers were deposited by means of CVAE in the AlTiN combination for the contact layer and VZrN in the top layer likewise by means of CVAE. An evaporator current of 150 A and a pressure of 6 Pa was in turn used for AlTiN; for VZrN a pressure of 3 Pa was used, after a corresponding pretreatment. This resulted in a considerable increase in roughness. The reason for this is the high droplet emission of the VZr cathodes. A roughness Ra of 0.42 μm was created.

Only cathodic vacuum evaporation processes for contact layer AlTiN and parallel operation AlTiN/VZrN and top layer VZrN:

After the same pretreatment and with the same process parameters, a nanostructured intermediate layer was now deposited between the contact layer and the top layer by the parallel operation of AlTi and VZr cathodic vacuum arc evaporators. This resulted in a further increase in roughness to Ra 0.55 μm. This is presumably due to the longer running time of the evaporation of the VZr cathodes by means of CVAE.

A layer system S in accordance with the invention. CVAE for AlTiN contact layer S1, CVAE of AlTiN in parallel operation with magnetron discharge in the HIPIMS mode, of VZrN for the intermediate layer S2 and the VZrN top layer S3 with magnetron discharge in the HIPIMS mode:

The layer S1 was deposited by means of CVAE. In the next step, the nanostructured layer S2 was produced by the combination of CVAE and HIPIMS between S1 and S3.

An embodiment of a coating method in accordance with the invention will be described in detail by way of example in the following for the layer example AlTiN/VZrN.

The magnetron discharge sources are operated in a bipolar mode in accordance with FIG. 3a. With, in the embodiment of FIG. 3a, the magnetron discharge sources Q2 being operated as an unbalanced magnetron (UBM magnetron) known per se in a closed-field arrangement.

In this respect, the two oppositely disposed magnetron discharge sources Q2 are operated in the following manner in the HIPIMS mode: On a first pulse P1, the magnetron discharge source at the top in the diagram is sputtered, with the magnetron discharge source Q2 at the bottom in the diagram being connected as an anode on the first pulse P1. On the following second pulse P2, the magnetron discharge source Q2 at the bottom in the diagram is sputtered, with the magnetron discharge source Q2 at the top in the diagram being connected as an anode on the second pulse P2.

The cathodic vacuum arc evaporation sources Q1 here each include 50 at % Al and 50 at % Ti, with a pair of two flanges each having three evaporators being actively arranged above one another.

The targets for the high current pulsing (HIPIMS) used in the two oppositely disposed magnetron discharge sources Q2 include 98.5 at % V and 1.5 at % Zr, with at % in each case standing for atomic percent within the framework of this application.

The specimens to be coated, not shown in FIG. 3a for reasons of clarity, were rotated three times in a manner known per se before the coating sources.

The coating of the specimens was in this respect carried out as follows in accordance with the invention:

1. Heating the substrates by radiant heaters to approximately 500° C.
2. Ion cleaning the substrates with Ar ions ion the AEGD process at 200 V bias voltage at the substrates.
3. Depositing the contact layer S1 using cathodic vacuum arc evaporation at e.g. 150 A, 100% reactive gas nitrogen flow approximately 1000 sccm with 6 Pa, 50 V, up to a layer thickness of approximately 900 nm.
4. Adding Ar to the gas mixture, e.g. 900 sccm N2 and 100 sccm Ar.
5. Igniting the two VZr targets (width 70 mm, length 700 mm) of the magnetron discharge sources Q2 behind a shutter (not shown in FIG. 3a) in the bipolar pulse mode. Pulse parameters: Pulse length 200 µs on, pulse break 800 µs off. Power ramped up from 1 to 10 KW. The maximum current density at the target amounted to approximately 0.4 A/cm². Layer thickness approximately 0.9 µm.
7. Switching off the cathodic vacuum arc evaporation sources Q1 and depositing the VZrN layer at a pressure of 0.8 Pa, 100 sccm Ar, 100 sccm N2 at a bias voltage of 50 V and pulse parameters of pulse length 150 µs on and pulse break 1000 µs off, resulting in a maximum current density of 0.75 A/cm² on the target with a layer thickness of 330 nm.

The layer growth rate in the contact layer S1 and in the intermediate layer S2 were almost identical at approximately 2300 nm/h. The layer growth rate of the top layer S3 amounted to approximately 170 nm/h.

V contents of less than 5 at % were measured by means of EDX measurements in the intermediate layer S2 which otherwise includes the elements Al, Ti and N. It can be assumed that Zr is very difficult to detect due to the low concentration in the target. These low amounts of elements introduced by the magnetron discharge sources Q2 are a consequence of the ratio of the layer growth rate between the cathodic vacuum arc evaporation sources Q1 and the HIPIMS magnetron of the magnetron discharge sources Q2 which was at approximately 1:14. In addition, it is possible that the sputtering rate at the intermediate layer S2 additionally turns out lower than in the top layer S3.

The REM break structure of a layer system S manufactured in accordance with the invention shows that the contact layer S1 grows in columnar form. The adjoining intermediate layer S2 has an almost identical columnar structure. The top layer S3 deposited by HIPIMS also has an extremely dense fine columnar structure. The columnar growth is therefore maintained in all layers S1, S2 and S3 of the layer system S.

A further important class of layer systems important in practice is represented by extremely oxidation resistant layers of the SiBNC type. These layers grow amorphously and serve as a top layer for oxidation protection. It is furthermore known that the introduction of alloy elements such as Si and B into ALTiN base layers increase their oxidation resistance. For this reason, the procedure of the layer sequence S1, S2, S3 was also selected here. The manufacture in accordance with the invention of such a layer using a unipolar mode with target will now be described in more detail in the following.

The cathodic vacuum arc evaporation sources Q2 were fitted with targets, each: 55 at % Al and 45 at % Ti at two flanges each having three evaporators active above one another.

The magnetron discharge sources Q2 (HIPIMS) were equipped with a mixture of ceramic components and binding portions having the following resulting composition 66 at % Si, 20 at % B and 14 at % C.

The specimens were positioned before the sources in double rotation on coating.

The coating of the specimens was in this respect carried out as follows in accordance with the invention:

1. Heating the substrates by radiant heaters to approximately 500° C.
2. Ion cleaning the substrates with Ar ions in the AEGD process at 200 V bias voltage at the substrates.
3. Depositing the first layer using cathodic vacuum arc evaporation, e.g. 150 A, reactive gas nitrogen (1000 Sccm) with 5 Pa, 50 V, up to a layer thickness of 2 µm.
4. Adding Ar to the gas mixture at a constant pressure, 850 sccm N2, 75 sccm Ar.
5. Igniting an SiBC target behind a shutter. Pulse parameters, pulse length 50 µs on, pulse break 950 µs off. Power ramped up from 1 to 2.5 kW. The resulting current density at the target amounted to approximately 0.2 A/cm².
6. Depositing the nanolayer composite layer up to a layer thickness of 4 µm.
7. Switching off the cathodic vacuum arc evaporation and depositing the SiBNC layer at a pressure of 0.8 Pa, 100 sccm Ar, 100 sccm N2 at a bias voltage of 50 V and pulse parameters of pulse length 100 µs on and pulse break 900 µs off at a power of 5 kW, resulting in a maximum current density of 0.4 A/cm2 on the target up to a layer thickness of 4.3 nm. The layer growth rate in the contact layer S1 and in the intermediate layer S2 was almost the same at 4,400 nm/h. The layer growth rate of the top layer S3 amounted to approximately 300 nm/h.

Si contents of less than 2 at % were measured by means of EDX measurements in the intermediate layer S2 which otherwise includes the elements Al, Ti and N. It can be assumed that B and C can also be detected in even smaller quantities, probably beneath 1 at %, using suitable measuring methods. These low amounts of elements introduced by the magnetron discharge sources Q2 are a consequence of the ratio of the layer growth rate between the cathodic vacuum arc evaporation of the vacuum arc evaporation sources Q1 and the magnetron discharge sources Q2 of the HIPIMS magnetron which was at approximately 1:15. It is in addition possible that the sputtering rate in the phase of depositing the intermediate layer S2 additionally turns out lower than in the phase of depositing the top layer S3.

An REM image of a break of the layer clearly shows three regions:

1. A columnar contact layer S1 manufactured by means of CVAE
2. An intermediate layer S2 in the form of a hybrid layer manufactured by means of CVAE/HIPIMS. A fine-grain growth is initiated, with this region probably also having an extreme nanolayer nature which can, however, only be detected using extremely high resolution examinations HRTEM, which were not available in the examinations.
3. An amorphous top layer deposited by means of HIPIMS.

It should be noted at this point that the transition from the columnar growth of the contact layer S1 to the fine-grain intermediate layer S2 arises by the hybrid operation of the vacuum arc evaporation source Q1 and the magnetron discharge source Q2. The integration of elements such as Si, B, C in this respect results in a grain refinement in AlTiN layers. The top layer S3 on the SiBNC base, however, tends to grow with an amorphous structure.

The layer element composition of the intermediate layer S2 can be varied with constant materials, evaporation material M1 and discharge material M2, and a constant bias voltage and constant other process parameters by the ratio of the flows of the layer-forming particles of the different material sources flanged to the flanges of the cathodic vacuum arc evaporation sources Q1 and of the magnetron discharge sources Q2. This can be the evaporator current of the CVAE, the power at the HIPIMS target or also simply the number of different active sources in a plane.

If the magnetron discharge sources M2 are operated at very high powers and/or if a plurality thereof are installed in one plane, the layer elements generated by these sources can then dominate.

In addition, there is the possibility of varying the individual layer thicknesses with nanolayer systems which can be influenced by the arrangement of the cathodic vacuum arc evaporation source Q1 and of the magnetron discharge source Q2 in the chamber. A plurality of materials M1 and M2 can naturally be used on different sources in order thus to produce more complex layers.

Furthermore, at least the operating of the sources of the type Q1 and of the type Q2 alternately in time is a method to set the integral portions within the total layer of the materials M1 and M2.

A time sequence of the operating of the sources Q1 and Q2 can also take place when a plurality of sources Q1 and Q2 using respective different materials are present.

In this respect, different approaches have proved advantageous during the trial performances. They will be briefly explained in the following. The already mentioned FIG. 1 b shows a process chamber 2 having four flanges provided with sources, two respective cathodic vacuum evaporation sources Q1 and two magnetron discharge sources Q2; to avoid a mutual coating, the positions of the sources Q1, Q2 can be masked by shutters SC11, SC12, SC21, SC22.

In a first method example for manufacturing the contact layer S1, the shutters SC11, SC12 are open in front of at least one cathodic vacuum arc evaporation source Q1 (CVAE). The shutters SC21, SC22 in front of the magnetron discharge sources Q2 are closed to avoid a coating of this source. In the phase for depositing the intermediate layer S2, the shutters SC21, SC22 in front of the magnetron discharge sources Q2 (HIPIMS) are likewise open. In the phase for depositing the top layer S3, the shutters SC11, SC12 are closed in front of the cathodic vacuum arc evaporation sources Q1 and open in front of the magnetron discharge sources Q2.

In a second method example, in accordance with FIG. 1c, a configuration entirely without shutters is shown, i.e. during the phase of depositing the contact layer 51 in accordance with the arrows PS the surface of the magnetron discharge sources Q2 is coated by the cathodic vacuum arc evaporation sources Q1 with the layer material M1 of the contact layer S1 with some 10 nm to some 100 nm when the magnetron discharge source Q2 is not active. This applies, for example, in the AlTiN layer systems listed at the top in the embodiment examples 1 and 2. This layer, which is applied to the magnetron discharge source Q2 is first removed on the start of the magnetron discharge source Q2 (HIPIMS) so that an ideal gradient of the layer properties (e.g. structure) takes place due to the parallel operation of the two different coating sources between the layers S1 to S2. If the deposition of the layer S2 is dispensed with, an ideal transition between S1 and S3 results.

In a third method example in accordance with FIG. 1d, a configuration is shown with deliberately open shutters SC21, SC22 in front of the magnetron discharge source Q2 when the contact layer S1 is deposited. The shape of the shutters SC21, SC22 and the length of the shutter opening during the layer deposition of the contact layer S1 determines the thickness of the deposition of the layer material which is produced by the cathodic vacuum arc evaporation sources Q1; the gradient of the layer properties (e.g. structure) can thus therefore be set due to the parallel operation of different coating processes and of the coating elements. This is, for example, the case with the AlTiN layer systems shown at the bottom in the above-described embodiments 1 and 2. If the deposition of the layer S2 is dispensed with, an ideal transition between S1 and S3 results.

The contact layer S1 is naturally not restricted to one layer material if a plurality of flanges, e.g. two, are located in the chamber. AlTi cathodes can, for example, be installed on one flange and TiSi cathodes on another flange. Corresponding multilayer or nanolayer layer systems can then be deposited. The same applies to the intermediate layer S2.

In a special case, the hybrid method can be started immediately by the omission of the layer S1 so that a layer sequence S2/S3 is created. They can then be stacked on one another in multiple form.

A preferred described magnetron configuration for the HIPIMS sputtering sources is, as already mentioned, an unbalanced magnetron (UBM magnetic field). This does not, however, necessarily have to be used; balanced magnetrons (BM magnetic fields) can naturally also be used. Furthermore, a closed-field configuration was in particular described in the case of the bipolar operation of two oppositely disposed magnetrons.

Configurations can, however, also be used without restriction which are not operated in the closed-field mode.

Further special operating modes in the phase of depositing the intermediate layer S2 and the top layer S3 of the HIPIMS magnetrons is the simultaneous starting of identical pulses to the magnetron, the simultaneous starting of different phases to the magnetron or the time-displaced starting of identical or different pulses.

All customary processes are suitable for the operating mode of the CVAE with the sources Q1 such as DC with largely constant values, pulsed DC between low current values and high current values, high-current pulsing.

In this respect, HIPIMS operation of magnetrons is to be understood within the framework of this application such that different operating modes can be used. Further discharges at the target can be operated in the pulse breaks to control the plasma discharge (e.g. positive voltage at the target for discharging) or to set a pre-ionization before the high-current pulsing. The additional discharges can also serve for the sputtering in the pulse breaks with small discharge powers in order thus, for example, to minimize target contaminations. This additional sputtering can be by means of DC discharges, NF, MF and RF; in this respect, the operating mode of the superimposition of MF with the actual high-current pulsing is preferably used.

The construction forms of the sources Q1 and Q2 can be selected as different so that circular, cylindrical or rectangular surfaces (targets, cathodes) to be atomized are available; further shapes are conceivable in this respect. If cylindrical targets are used, they can also be operated in rotating form to ensure an ideal target utilization.

The arrangement and number of the sources Q1 of CVAE and Q2 for HIPIMS discharge can be selected as desired to the extent that the aim in accordance with the invention can be realized. The sources do not have to be opposite one another, for example, but can have any desired angles between one another.

In this respect, filtered arc sources can also be used as sources Q1. It can also be technically realized to provide the sources Q2 of the HIPIMS discharge with filters.

Hard carbon layers can, for example, also be produced in that first a Cr/CrN layer S1 is deposited using Q1 of CVAE. S2 follows this as an operation of Q1 by means of Cr and Q2 by means of a graphite target. The operating mode can also have time interruptions. An S2 with CrxCy portions is created. A hard carbon layer of the type a-C is then deposited on this by means of the source Q2. During this phase, a combination with a PA-CVD process is also conceivable which delivers layer portions via a gas containing hydrocarbon so that a-C:H layers are created.

With substrates in accordance with the invention, the contact layer in this respect preferably has a thickness of 0-50,000 nm, the intermediate layer (S2) preferably a thickness of 50 nm-10,000 nm and the top layer (S3) preferably a thickness of 10 nm-10,000 nm.

The invention claimed is:

1. A coating method for depositing a layer system formed from hard material layers on a substrate, comprising:
    providing an evacuable process chamber having a cathodic arc evaporation source with an evaporation material and having a magnetron discharge source with a discharge material, wherein the magnetron discharge source is operable in a HIPIMS mode;
    depositing at least one contact layer including the evaporation material on the surface of the substrate in a cathodic vacuum arc evaporation process only via the cathodic vacuum arc evaporation source;
    after depositing the contact layer, depositing at least one intermediate layer in a form of a nanostructured mixed layer, including the evaporation material and the discharge material, by parallel operation of the cathodic vacuum arc evaporation source and of the magnetron discharge source, with the magnetron discharge source being operated in the HIPIMS mode; and
    after depositing the at least one intermediate layer, depositing at least one top layer including the material only via the magnetron discharge source, with the magnetron discharge source being operated in the HIPIMS mode,
    wherein, for depositing the at least one intermediate layer in the form of a nanostructured mixed layer, during which the cathodic vacuum arc evaporation source and of the magnetron discharge source operating in HIPIMS mode are operated in parallel, a coating pressure in a range from 0.5 Pa to 20 Pa is used.

2. The coating method in accordance with claim 1, wherein in the depositing via the cathodic vacuum arc evaporation method the contact layer is formed as a nitride contact layer and/or the intermediate layer is formed as a nitride intermediate layer.

3. The coating method in accordance with claim 1, wherein in the depositing via the cathodic vacuum arc evaporation method the contact layer is formed as a carbide contact layer and/or the intermediate layer is formed as a carbide intermediate layer.

4. The coating method in accordance with claim 1, wherein in the depositing via the cathodic vacuum arc evaporation method the contact layer is formed as a boride contact layer and/or the intermediate layer is formed as a boride intermediate layer.

5. The coating method in accordance with claim 1, wherein in the depositing via the cathodic vacuum arc evaporation method the contact layer is formed as an oxide contact layer and/or the intermediate layer is formed as an oxide intermediate layer.

6. The coating method in accordance with claim 1, wherein in the depositing via the cathodic vacuum arc evaporation method the contact layer and/or the intermediate layer is formed as a Ti base layer, a Zr base layer, a WC base layer or as an AlTi base layer, a Cr base layer, a TiSi base layer or as an AlCr base layer.

7. The coating method in accordance with claim 1, wherein on the coating via the magnetron discharge source the intermediate layer and/or the top layer is formed as a VMe nitride layer, where Me is a metal.

8. The coating method in accordance with claim 1, wherein on the coating via the magnetron discharge source the intermediate layer and/or the top layer is formed as a VZrN layer by VZrN sputtering.

9. The coating method in accordance with claim 1, wherein on the coating via the magnetron discharge source the intermediate layer and/or the top layer is formed as an MeSiBNCO layer, where Me is a metal.

10. The coating method in accordance with claim 1, wherein on the coating via the magnetron discharge source the intermediate layer and/or the top layer is formed as an SiBNC layer by SiBNC sputtering, with SiBC in particular being formed in the composition Si=66 at %, B=20 at % and C=14 at % in the intermediate layer and/or the top layer.

11. The coating method in accordance with claim 1, wherein the magnetron discharge source is set on the sputtering in the HIPIMS mode for depositing the intermediate layer and/or for depositing the top layer, such that, in a pulse peak, at least one current density of 0.1 A/cm$^2$ is reached.

12. The coating method in accordance with claim 1, wherein the magnetron discharge source is set on the sputtering in the HIPIMS mode for depositing the intermediate layer and/or for depositing the top layer such that pulse lengths between 10 µs and 5000 µs and pulse breaks between 100 µs and 10,000 µs are reached.

13. The coating method in accordance with claim 1, wherein the magnetron discharge source is coated by the cathodic vacuum arc evaporation source with evaporation material.

14. The method according to claim 1, wherein the form of the nanostructured mixed layer comprises a form of a nanolayer intermediate layer in a hybrid phase or a nanocomposite layer.

15. The coating method in accordance with claim 8, wherein the VZrN layer comprises VZr formed in a composition of V=98.5 at % and Zr=1.5 at % in at least one of the intermediate layer and the top layer.

16. The coating method in accordance with claim 11, wherein, in the pulse peak, at least one current density of at least 0.3 A/cm$^2$ is reached.

17. The coating method in accordance with claim 12, wherein a ratio of pulse length:pulse break is set in a range from 1:3 to 1:20.

18. A coating method in accordance with claim 1, wherein, for depositing the at least one intermediate layer in the form of a nanostructured mixed layer, during which the coating pressure at which the cathodic vacuum arc evaporation source and of the magnetron discharge source operated in HIPIMS mode are operated in parallel, the coating pressure in a range from 1 Pa to 10 Pa is used.

19. the coating method in accordance with claim 1, wherein the coating pressure used for the parallel operation of the cathodic vacuum arc evaporation source and of the magnetron discharge source is about 6 Pa.

\* \* \* \* \*